United States Patent
Wang et al.

(10) Patent No.: US 8,501,590 B2
(45) Date of Patent: Aug. 6, 2013

(54) APPARATUS AND METHODS FOR DICING INTERPOSER ASSEMBLY

(75) Inventors: Chung Yu Wang, Hsin-Chu (TW); Kung-Chen Yeh, Taichung (TW); Chih-Wei Wu, Zhuangwei Township (TW); Szu Wei Lu, Hsin-Chu (TW); Jing-Cheng Lin, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 51 days.

(21) Appl. No.: 13/176,606

(22) Filed: Jul. 5, 2011

(65) Prior Publication Data

US 2013/0009316 A1    Jan. 10, 2013

(51) Int. Cl.
*H01L 21/78*   (2006.01)

(52) U.S. Cl.
USPC .................................. 438/462; 257/E21.599

(58) Field of Classification Search
None
See application file for complete search history.

(56) References Cited

U.S. PATENT DOCUMENTS

| | | |
|---|---|---|
| 4,811,082 A | 3/1989 | Jacobs et al. |
| 5,380,681 A | 1/1995 | Hsu |
| 5,481,133 A | 1/1996 | Hsu |
| 6,002,177 A | 12/1999 | Gaynes et al. |
| 6,187,678 B1 | 2/2001 | Gaynes et al. |
| 6,229,216 B1 | 5/2001 | Ma et al. |
| 6,236,115 B1 | 5/2001 | Gaynes et al. |
| 6,271,059 B1 | 8/2001 | Bertin et al. |
| 6,355,501 B1 | 3/2002 | Fung et al. |
| 6,434,016 B2 | 8/2002 | Zeng et al. |
| 6,448,661 B1 | 9/2002 | Kim et al. |
| 6,461,895 B1 | 10/2002 | Liang et al. |
| 6,562,653 B1 | 5/2003 | Ma et al. |
| 6,570,248 B1 | 5/2003 | Ahn et al. |
| 6,600,222 B1 | 7/2003 | Levardo |
| 6,607,938 B2 | 8/2003 | Kwon et al. |
| 6,661,085 B2 | 12/2003 | Kellar et al. |
| 6,762,076 B2 | 7/2004 | Kim et al. |
| 6,908,565 B2 | 6/2005 | Kim et al. |
| 6,908,785 B2 | 6/2005 | Kim |
| 6,943,067 B2 | 9/2005 | Greenlaw |
| 7,087,538 B2 | 8/2006 | Staines et al. |
| 7,151,009 B2 | 12/2006 | Kim et al. |
| 7,215,033 B2 | 5/2007 | Lee et al. |
| 7,276,799 B2 | 10/2007 | Lee et al. |
| 7,279,795 B2 | 10/2007 | Periaman et al. |
| 7,317,256 B2 | 1/2008 | Williams et al. |
| 7,345,350 B2 | 3/2008 | Sinha |
| 7,402,442 B2 | 7/2008 | Condorelli et al. |
| 7,402,515 B2 | 7/2008 | Arana et al. |
| 7,410,884 B2 | 8/2008 | Ramanathan et al. |
| 7,494,845 B2 | 2/2009 | Hwang et al. |

(Continued)

*Primary Examiner* — Seahvosh Nikmanesh
(74) *Attorney, Agent, or Firm* — Slater & Matsil, L.L.P.

(57) ABSTRACT

Methods and apparatus for performing dicing of die on wafer interposers. Methods are disclosed that include receiving an interposer assembly including one or more integrated circuit dies mounted on a die side of an interposer substrate and having scribe areas defined in spaces between the integrated circuit dies, the interposer having an opposite side for receiving external connectors; mounting the die side of the interposer assembly to a tape assembly, the tape assembly comprising an adhesive tape and preformed spacers disposed between and filling gaps between the integrated circuit dies; and sawing the interposer assembly by cutting the opposite side of the interposer in the scribe areas to make cuts through the interposer, the cuts separating the interposer into one or more die on wafer assemblies. Apparatuses are disclosed for use with the methods.

16 Claims, 12 Drawing Sheets

U.S. PATENT DOCUMENTS

| | | |
|---|---|---|
| 7,528,494 B2 | 5/2009 | Furukawa et al. |
| 7,531,890 B2 | 5/2009 | Kim |
| 7,576,435 B2 | 8/2009 | Chao |
| 7,605,019 B2 * | 10/2009 | Simon et al. ............. 438/109 |
| 7,834,450 B2 | 11/2010 | Kang |
| 7,858,499 B2 | 12/2010 | Plaut et al. |
| 7,948,071 B2 * | 5/2011 | Thomas et al. ............ 257/686 |

* cited by examiner

73

APPARATUS AND METHODS FOR DICING INTERPOSER ASSEMBLY

RELATED APPLICATIONS

This application is related to U.S. application Ser. No. 13/246,556, filed on Sep. 27, 2011, entitled "Apparatus and Methods for Molding Die on Wafer Interposers," which is hereby incorporated in its entirety herein by reference.

BACKGROUND

A common requirement of current integrated circuit manufacturing and packaging is the use of interposers to receive multiple integrated circuit dies. The use of through vias or through silicon vias ("TSVs") is increasing. These through vias allow electrical coupling between integrated circuit dies and components mounted on one side of an interposer, and terminals such as solder balls mounted on the opposite side of the interposer. Further, the use of TSV technologies with silicon interposer substrates enable wafer level processing ("WLP") of the interposer assemblies. A form factor useful for mounting multiple integrated circuit dies (ICs) is to use a wafer substrate such as a semiconductor wafer with TSVs to make through wafer connections. The ICs may be mounted on one side of the silicon wafer, and at least some terminals of the ICs may be coupled to the TSVs in the interposer. Board level connections such as solder balls, bumps, or columns may be formed on the opposite side of the interposer and coupled to the ICs using the TSVs. The assembly may now be mounted to a circuit board using solder reflow techniques and the solder bumps or balls. The use of TSV through wafer connections also allows for the capability of vertical stacking of the assemblies, enabling manufacturers to increase integrated circuit component density and system performance without increasing circuit board area. This technique is increasingly applicable to increasing memory or storage device density, for example, without added circuit board area. As demand for hand held and portable devices such as smart phones and tablet computers increases, board area and board size restrictions also increases, and the use of the interposer assemblies and TSVs can meet these requirements. These techniques apply to semiconductor wafers such as silicon wafers, but may also apply to other interposer materials, for example BT resin and other interposer materials, where through via connections, conductive patterning for connecting components, and component mounting may be performed.

During processing of the dies mounted on the wafer interposer, which may be referred to as a "die on wafer" ("DOW") assembly, a wafer dicing step is performed to separate the individual integrated circuit die components, each of which may include several ICs mounted on one side of the interposer, and a group of circuit board connections such as the solder columns, solder bumps or solder balls mounted on the opposite side, into separate assembly units. This process may be referred to as "singulation". During wafer sawing, a wet blade is used to saw through the wafer in scribe areas in gaps ("scribe lines") between the ICs. Conventional sawing or "dicing" techniques are available for semiconductor wafers. An adhesive tape known as dicing tape is typically used to secure the wafer and keep it stationary during dicing. During dicing, a wet sawing operation cuts the wafer along the scribe lines. However a DOW wafer assembly has integrated circuit dies mounted on one side and the solder balls or solder bumps on the other side. Neither side of the DOW assembly is free from mounted objects. Neither side of the DOW assembly provides a simple planar surface for mounting to a conventional dicing tape. Because the sawing operation in the dicing process is a mechanical operation using a high speed rotating blade and jetting water, vibration occurs. In attempts to dice the assemblies using conventional approaches, damage to the interposer in the form of wafer chipping, damage to the ICs, including demounting of the ICs, and damage to the solder balls has been observed. Water penetration inducing die fly or die tilt has been observed when dicing. Tape peel-off in between the tape adhesive and silicon interposer induced by a non-planar surface on either side of interposer during the dicing operation has been observed. Any of these problems lead to failures which can cause large loss of known good dies ("KGDs") at the dicing stage, which greatly increases the cost and lowers yield of the circuit assemblies.

A continuing need thus exists for methods and systems to efficiently perform dicing for interposer assemblies without damage to the interposer, to the mounted ICs or to the connection terminals. Improvements are needed to increase manufacturing yields, and to reduce damage to finished devices currently experienced when using the known methods.

BRIEF DESCRIPTION OF THE FIGURES

For a more complete understanding of the present embodiments, and the advantages thereof, reference is now made to the following descriptions taken in conjunction with the accompanying drawings, in which.

The drawings, schematics and diagrams are illustrative and not intended to be limiting, but are examples of embodiments of the invention, are simplified for explanatory purposes, and are not drawn to scale.

DETAILED DESCRIPTION

The making and using of the embodiments are discussed in detail below. It should be appreciated, however, that the embodiments provide many applicable inventive concepts that can be embodied in a wide variety of specific contexts. The specific embodiments discussed are merely illustrative of specific ways to make and use the embodiments, and do not limit the scope of the embodiments or the claims.

Embodiments of the present application which are now described in detail provide novel methods and apparatus embodiments for manufacturing die on interposer assemblies efficiently by providing support mechanisms and securing methods to secure the die on interposer assembly during dicing operations. By providing a secure mounting method and dicing apparatus, the dicing operation can be performed without chipping of the interposer, demounting or damage to the ICs mounted on the interposer, and without damage to the terminals such as solder balls mounted on the wafer. The loss of KGD IC devices in the dicing operation is reduced or eliminated, yield is increased and accordingly, the unit costs are lowered. In embodiments, materials are used that allow easy pick and place operations following the dicing operations, further enhancing efficiency and yield.

In order to illustrate the embodiments and their operation, example assembly process steps are first described. These are simplified and illustrative only and do not limit the embodiments or the scope of the claims, and these examples are presented for explanation and understanding of the embodiments.

Figure 1:
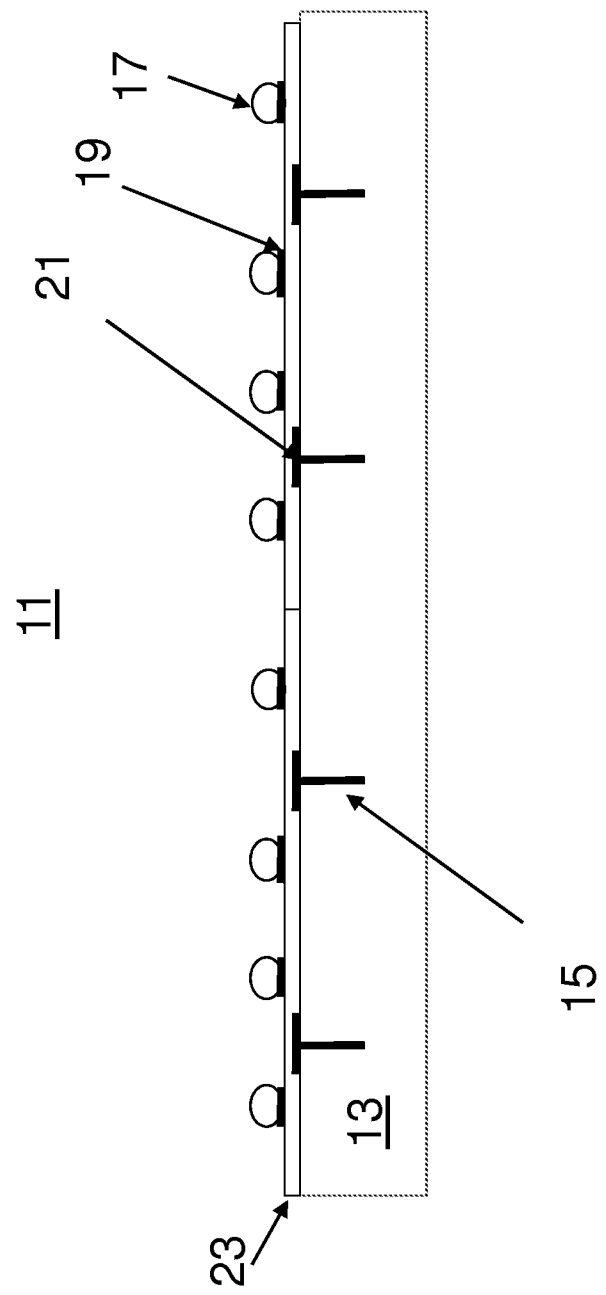
FIG. 1 depicts in a cross-section an illustrative assembly in an intermediate process for use with the embodiments.

FIG. 1 depicts in a cross-section an interposer assembly 11. In FIG. 1, substrate 13 is depicted. This substrate may be a silicon wafer, a semiconductor substrate, glass, ceramic, BT resin, epoxy resin or another substrate material for interposers.

Through substrate vias ("TSVs") 15 are shown extending vertically into the substrate 13. These are formed as "blind vias" using photolithography, developing, patterning, etching, and electroplating steps. For example, the TSVs may be completed using copper or another conductor material electroplated into the vias. Barrier layers and seed layers may be used. The pads 21 that overlie the TSVs 15 may couple the TSVs one to another, or, may be used to couple to the integrated circuits (not shown) that will be mounted in a later step.

A passivation layer 23 is formed over the substrate 13. Microbump connections are formed. The bumps 17 are formed over under bump metallization ("UBM") 19. The bumps 17 may be formed of solder including lead based solder or lead free solder, typically eutectic materials such as SnAg (SA) or SnAgCu ("SAC") may be used for lead free applications. These materials form a compound with a melting point that is compatible with solder reflow steps, as are known in the art. In some embodiments, the bumps 17 are microbumps.

Figure 2:
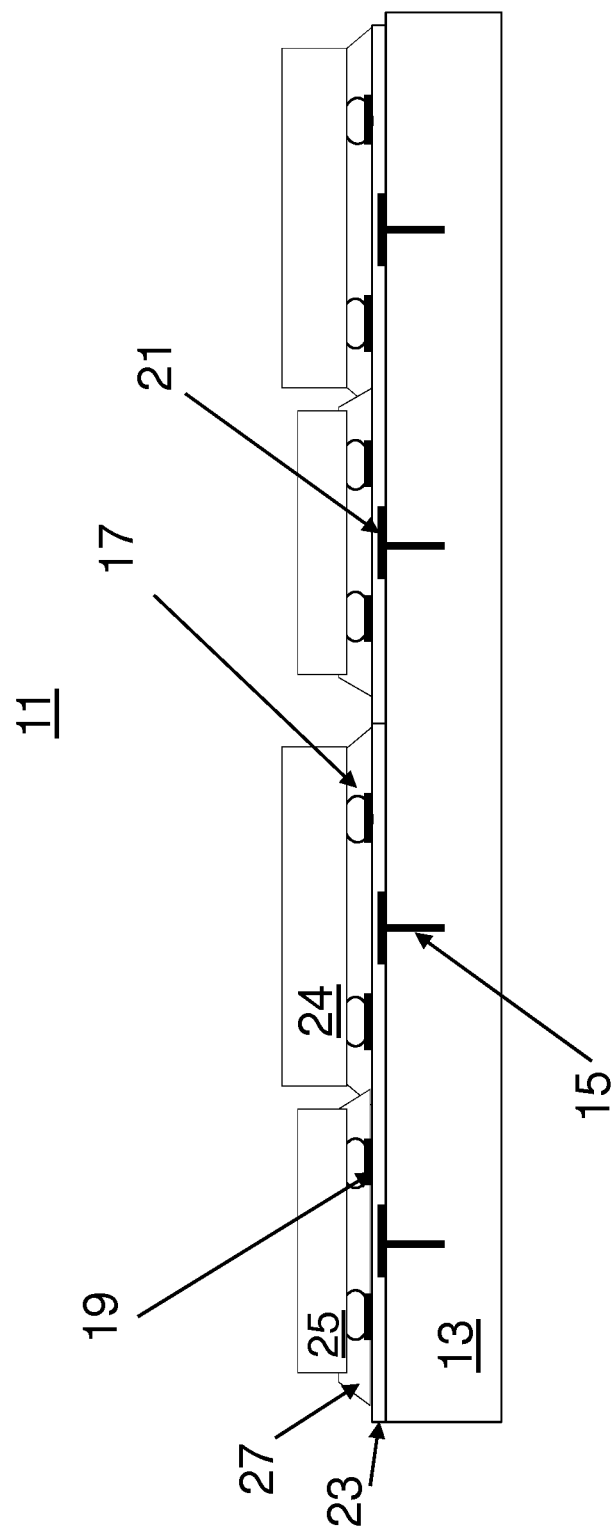
FIG. 2 depicts in a cross-section the assembly of FIG. 1, following additional processing.

FIG. 2 depicts in a cross-sectional view the interposer assembly 11 following the mounting of integrated circuit dies 24 and 25. Note that these ICs may be of different types and may therefore have different thicknesses, as shown in the figure. However this is only one example and IC dies 24 and 25 can be of the same type, and have the same thickness, as well. The IC dies 24 and 25 may have a thickness up to 600 microns, for example. An underfill 27 is applied after the IC dies are mounted in a solder reflow operation that melts the bumps to form physical and electrical connection to the substrate 13. The underfill protects the bumps during processing and in the system, during thermal stress. The IC dies 24 and 25 may be coupled one to another electrically to form a system, although this is not necessary in all applications where the embodiments are used.

Figure 3:
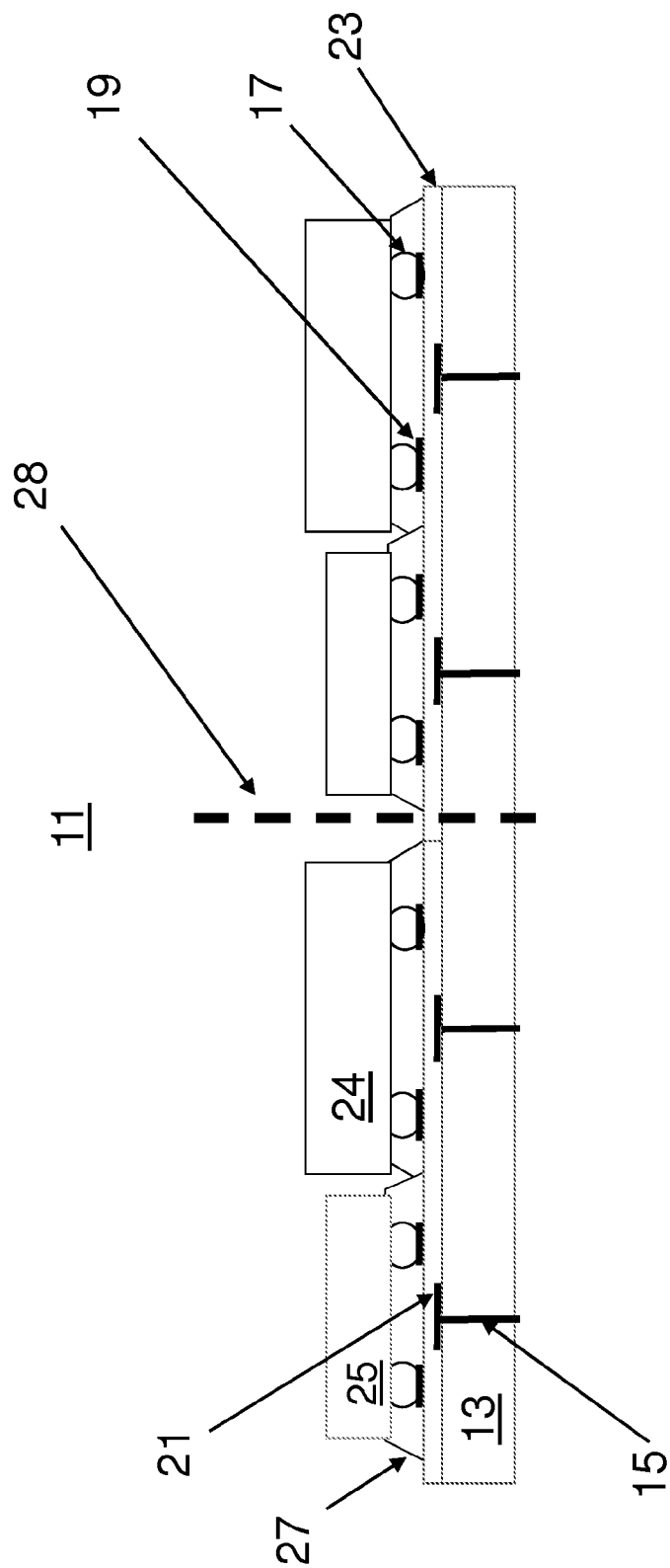
FIG. 3 depicts in a cross-section the assembly of FIG. 2, following additional processing.

FIG. 3 depicts in another cross-sectional view the interposer assembly 11 following additional processing steps. The substrate 13 is subjected to a substrate thinning operation, for a semiconductor wafer substrate the thinning is performed by a backside grinding operation. The thinning continues through physical grinding and/or chemical etching until the bottom ends of the TSVs 15 are exposed on the bottom surface of the substrate 13, as shown in FIG. 3. Following the backside grinding operation, the substrate 13 may be thinned to a thickness less than 200 microns, for example between 100-200 microns, as a non-limiting example.

In FIG. 3, the line 28 indicates a scribe line area. This line indicates a place where the substrate will be cut to separate the interposer assembly into individual assemblies in the dicing operation.

Figure 4:
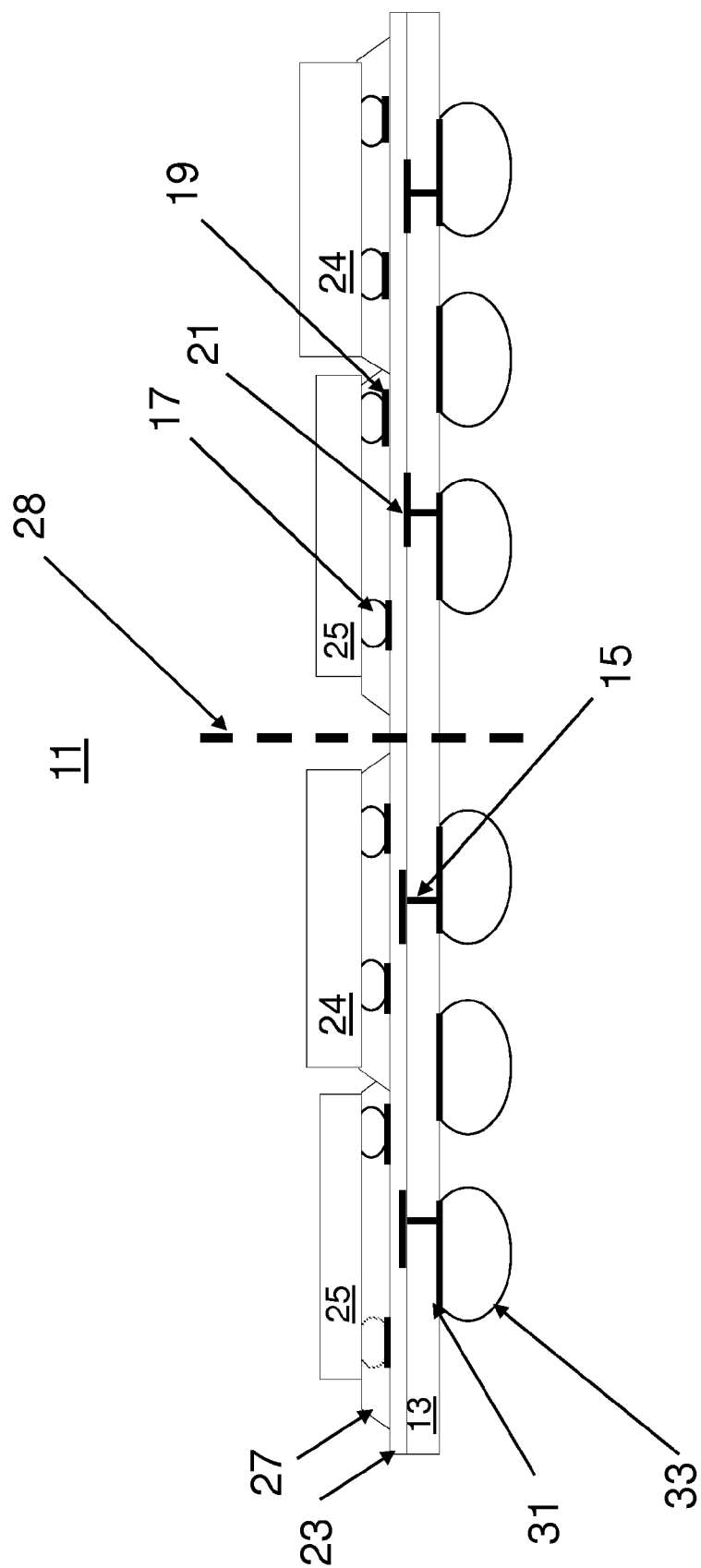
FIG. 4 depicts in a cross-section the assembly of FIG. 3, following additional processing.

FIG. 4 depicts in another cross-section the interposer assembly 11 following an additional process step. Solder balls 33 are now shown disposed on the solder ball side (here, the bottom surface) of the substrate 13, with the integrated circuit dies 25 and 24 disposed on the die side of the substrate 13, (here the top surface). The solder balls 33 are coupled to at least some of the TSVs 15 and are formed on pads 31 overlying the TSVs. The bottom surface of the substrate 13 may have a redistribution layer ("RDL") forming connections that run horizontally and map the solder balls to different TSVs, to provide flexibility in the solder ball placement. The solder balls 33 may be a lead based, or lead free solder, and are compatible with solder reflow processes that will be used later to mount the interposer assemblies to a mother board, a system board or the like in the target system. In some embodiments, the solder balls 33 are replaced by metal posts. The metal posts may be formed of copper, copper alloys, or any suitable metallic materials. The pads 31 may have various plating treatments to increase adhesion, provide diffusion barriers, prevent oxidation, and increase solderability, including nickel, gold, platinum, palladium, copper, and their alloys, and including such treatments as electroless nickel immersion gold ("ENIG"), electroless nickel electroless palladium immersion gold ("ENEPIG") and the like.

The interposer assembly 11 is shown in FIG. 4 after backside grinding and solder ball mount. The interposer assembly 11 is now ready for the dicing operation; in this example, at scribe line 28. The saw blade at the dicing stage will cut through the substrate 13 along this line and separate the assembly into two parts. These may be identical assemblies and although only two are shown in this simple illustration in FIG. 4, many more may be formed on a silicon wafer using WLP assembly to increase yield. The IC dies 24 and 25 are paired together and the pairs repeat across the wafer, separated by die to die gaps which include the scribe line areas.

The substrate 13 is now very thin. The substrate 13 after backside grinding is thus easily damaged. If a conventional dicing approach is attempted, the assembly may be mounted with the solder balls 33 down, or the integrated circuit dies facing down. A tape with adhesive may be disposed on the solder balls, for example. However, the solder balls mounted on a dicing tape do not prevent vibration of the substrate 13 during dicing, due to the space that is formed vertically between the tape and the substrate. In such an arrangement, many problems are observed during dicing including demounting of ICs, die easily fly, chipping and damage to the interposer, and demounting of the solder balls all have been observed. If a different tape, such as a backgrinding tape, is used with the balls down, the balls may become embedded in the adhesive. Backgrinding tape uses a softer adhesive material, serious interposer backside chipping is found when this tape is used, and the subsequent pick and place operations to remove the assemblies from the tape after singulation may dislodge the solder balls, or otherwise be difficult. If the interposer assembly 11 is instead placed die side down on a dicing or backgrinding tape, the difference in thickness in the dies 24, 25 may lead to additional vibration damage, and again the substrate 13 is not supported between the dies and thus, chipping may occur. Also, the edges of the substrate 13 do not have any dies or balls and these areas are unsupported in any event, leading to additional vibration and damage during dicing.

Figure 5:
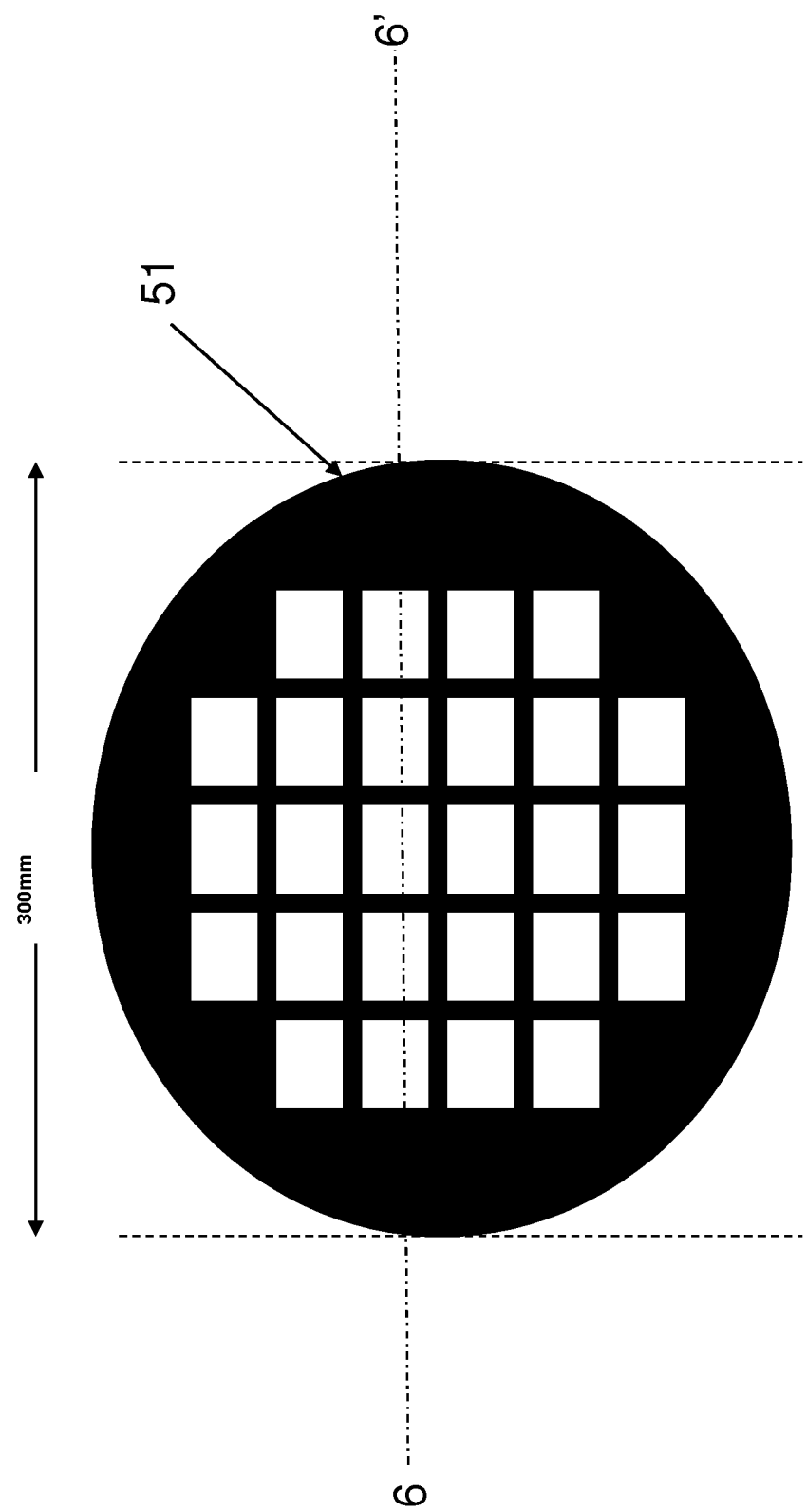
FIG. 5 depicts in a plan view an embodiment wafer carrier.
Figure 6:
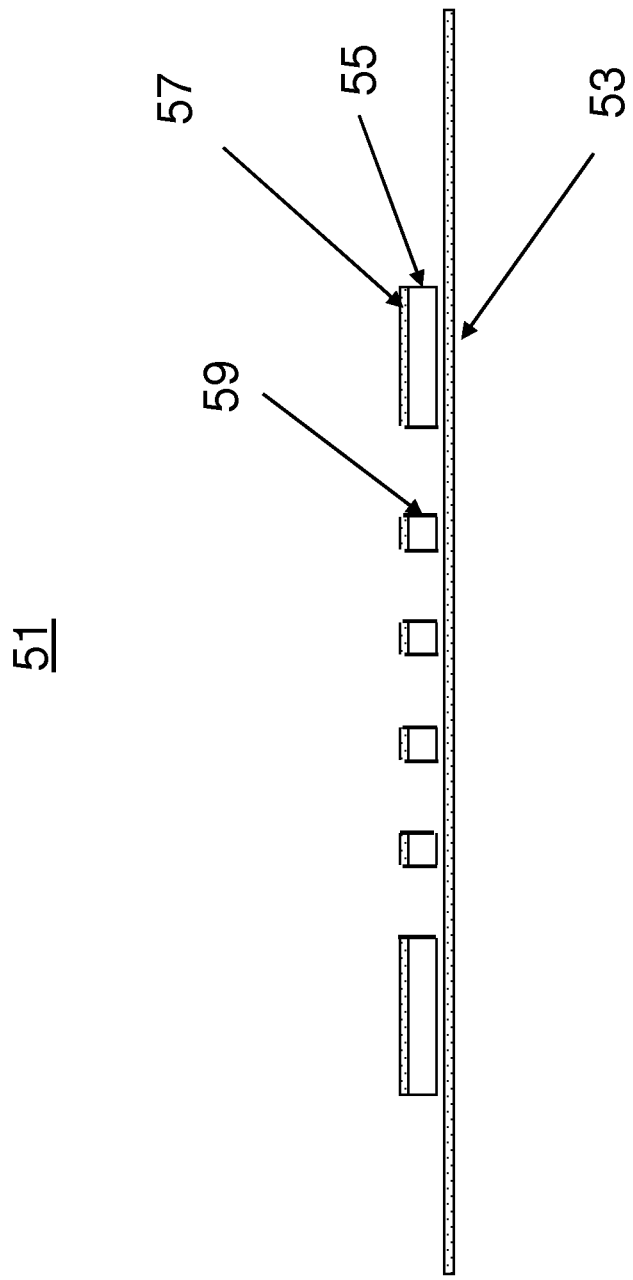
FIG. 6 depicts in a cross-section a portion of the embodiment of FIG. 5.

FIG. 5 depicts a wafer carrier assembly 51 that may be used with an embodiment. The wafer carrier assembly 51 is sized and patterned to correspond to substrate 13 and has areas that correspond to the dies 24 and 25 on the substrate. For a non-limiting example, if the substrate 13 is a 300 millimeter wafer, then the wafer carrier assembly 51 would also be 300 millimeters in diameter. The line 6-6' indicates a cross-section of the wafer carrier 51 that is depicted in FIG. 6. Wafer carrier assembly 51 is used in a "die down" arrangement to secure the interposer assembly 11 during dicing, as is further described below.

In FIG. 6, a cross-section along line 6-6 of FIG. 5 is shown. A fixture 55 is patterned and manufactured with preformed tape on top of this patterned fixture, followed by placing the interposer wafer with the dies into the above fixture with preformed tape. Then, a lamination step is performed to laminate a dicing tape 53 on the combined interposer and fixture. This tape may be a dicing tape with an adhesive, for example. In an alternative embodiment, the dicing tape may be UV erasable (having an adhesive is initially quite strong, but that loses strength on exposure to UV, so that by UV exposure after dicing, the tape loses adhesive strength, easing release after dicing). The fixture 55 is patterned on the wafer carrier assembly 51 to fill the gaps between the dies 24 and 25 (shown at 59 in FIG. 6) on the substrate 13, and is sufficiently thick to fill the spaces that will form between the tape 53 and substrate 13 in areas between the dies 24 and 25. Fixture 55 is also shown disposed at the edges of the wafer carrier assembly 51 which corresponds to the edges of substrate 13 that are free from integrated circuit dies, when the tape is mounted to the substrate 13 with the dies "down" and facing the tape. A preformed tape layer 57 may be provided as part of fixture 55 to secure it to the substrate 13 and act as dicing tape and support on following dicing. The fixture 55 may be of organic or inorganic materials compatible with wafer processing, such as stainless steel, silicon, ceramic, polymer, tape, films or other materials. Preformed tape 57 may be of conventional dicing tape, double side adhesive tape or UV curable tape, or other materials.

Figure 7:
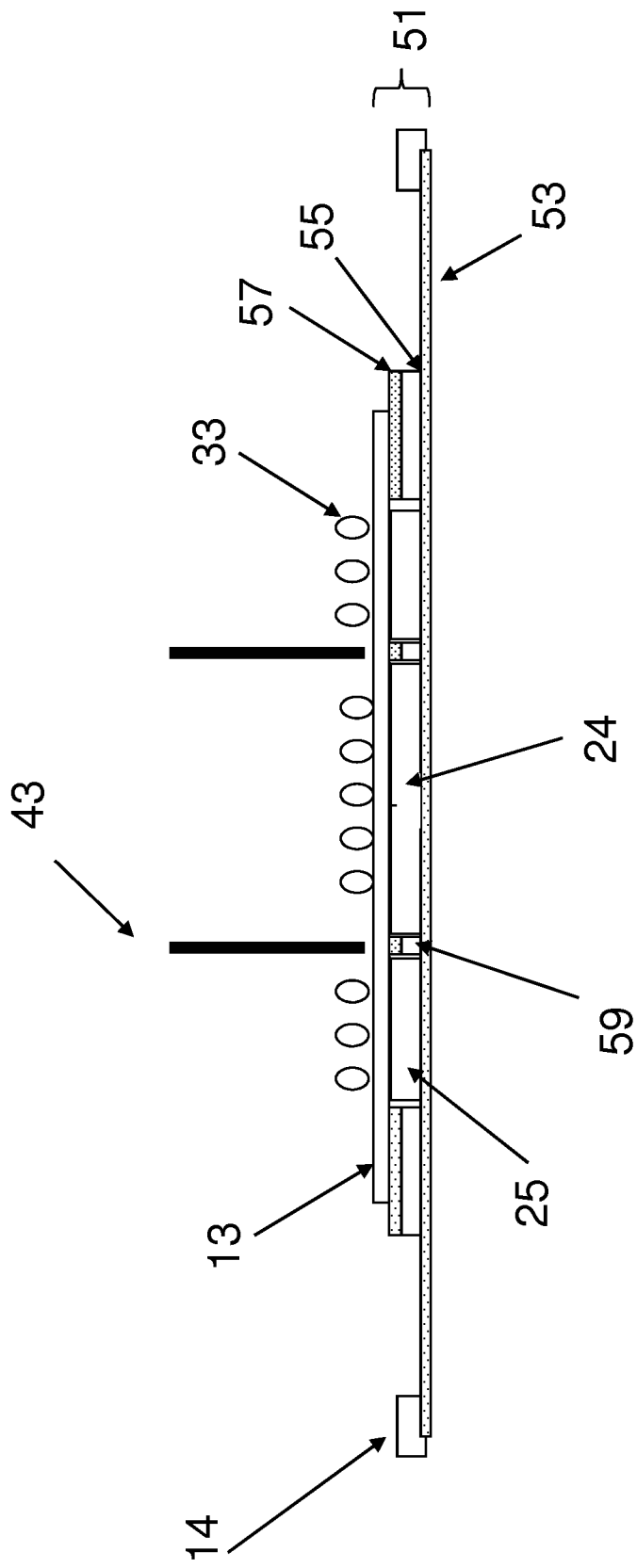
FIG. 7 depicts in a cross-section an embodiment wafer carrier in use with an illustrative die on wafer assembly.

FIG. 7 depicts in a cross-section the wafer carrier assembly 51 used with an interposer assembly including substrate 13, having integrated circuit dies 24, 25 mounted on the die side of substrate 13 (now drawn as the bottom surface), and having solder balls 33 on the opposite side of the substrate 13. The saw blades 43 are shown aligned with spaces between the dies 24, 25. Note that the fixture 55 with preformed tape 57 fills the vertical gap between the tape 53 of wafer carrier assembly 51 and the substrate 13. This thickness corresponds to the die thickness and may be, for example 500 microns-600 microns for a die that is 600 microns thick. Other thicknesses may be used to fill the vertical gap for other die thicknesses. The gap between dies filled by portion 59 may be 1-2 microns or more, a range of 1-20 microns is typical but the gap size is not limiting on the embodiments, the fixture 55 with preformed tape 57 will be patterned to fill the horizontal spaces between the dies, whatever space is used.

In FIG. 7, a carrier frame 14 is shown in cross-section, as is known in the wafer processing art, the wafer carrier assembly 51 may be mounted to a carrier frame to provide ease of handling. The dicing saw blades 43 will, in a wet sawing operation, slice through the substrate 13 in scribe line areas between the solder balls 33 and corresponding to gaps between the dies 24 and 25, and the wafer carrier assembly 51 will secure the portions together during the sawing, preventing damage to the substrate 13, the solder balls 33, and the integrated circuit dies 24, 25, during the sawing. The wafer carrier assembly 51 will also provide an easy means to transport the devices away from the dicing stage. In an embodiment, the wafer carrier 51 assembly includes UV erasable dicing tape, and UV energy is used after dicing to change the adhesive strength to a much lower strength, so that the now singulated portions of substrate 13 and the corresponding dies 24, 25, and the corresponding solder balls 33, may be separated into the individual assemblies. Pick and place equipment may be used to physically separate the completed assemblies from the wafer carrier assembly 51 after dicing.

Figure 8:
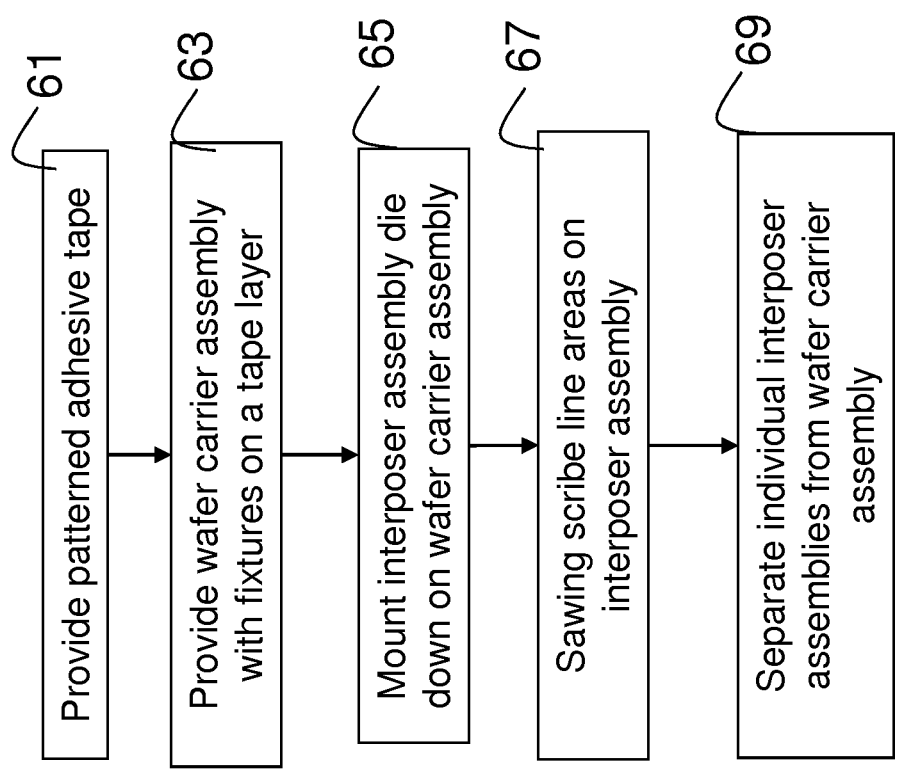
FIG. 8 depicts in a flow diagram an embodiment method.

FIG. 8 depicts, in a flow chart, a method embodiment using the wafer carrier assembly as described above. In step 61, the adhesive tape is provided in a pattern corresponding to the die locations of the interposer. In step 63, the fixtures are disposed onto the adhesive tape. In step 65, the interposer assembly is mounted with the die side down on the wafer carrier assembly. In step 67, the sawing operation is performed and cuts are made by sawing through the substrate in the scribe line area on the solder bump side of the substrate. In step 69, the individual interposer assemblies are separated from the wafer carrier assembly. In an alternative embodiment, this step may include UV energy applied to the tape, if it is a UV erasable adhesive, to lower the adhesion strength, prior to a pick and place or other transport operation to remove the individual assemblies from the wafer carrier.

Figure 9:
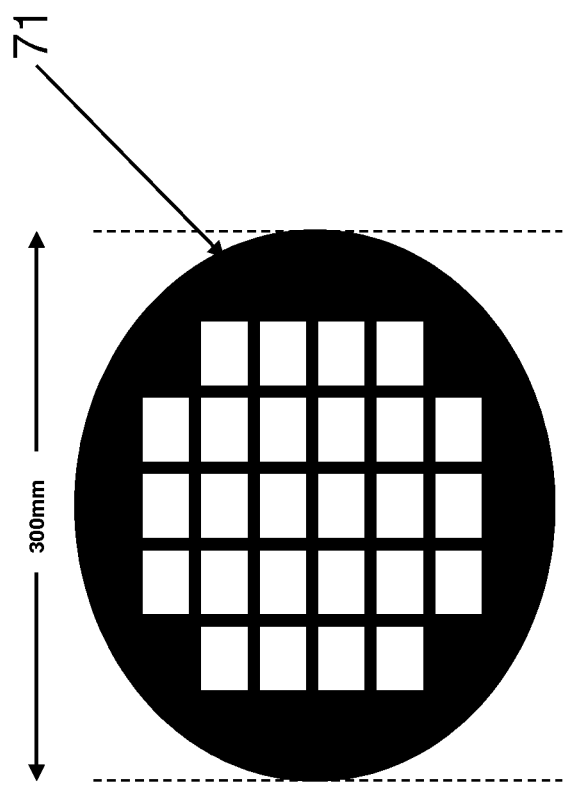
FIG. 9 depicts in a plan view an alternative embodiment wafer carrier.

FIG. 9 depicts another embodiment wafer carrier 71. In this embodiment, the wafer carrier may be, for example, dicing tape, backgrinding tape, or other adhesive tapes used in wafer processing. The wafer carrier 71 will be a size that corresponds to the substrate 13, for example, if the substrate 13 is a 300 millimeter (12 inch) semiconductor wafer, then the wafer carrier will be of corresponding size. The embodiments may be used with any substrate size however, including for example 3 inch, 8 inch, or other sizes of semiconductor wafers, or other substrate sizes.

Figure 10:
FIG. 10 depicts in a cross-section a portion of a fixture for use with the embodiment of FIG. 9.

FIG. 10 depicts in cross-section a fixture 73 for use with the embodiment of FIG. 9. As will be described in detail below, the fixture 73 is used after the wafer carrier of FIG. 9 has the interposer assembly mounted to it, and the fixture 73 is positioned on the side of the wafer carrier 71 that is opposite the side that adheres to the die side of the interposer assembly. In this alternative, then, the fixture 73 is applied after the interposer assembly is mounted to the wafer carrier 71.

Figure 11:
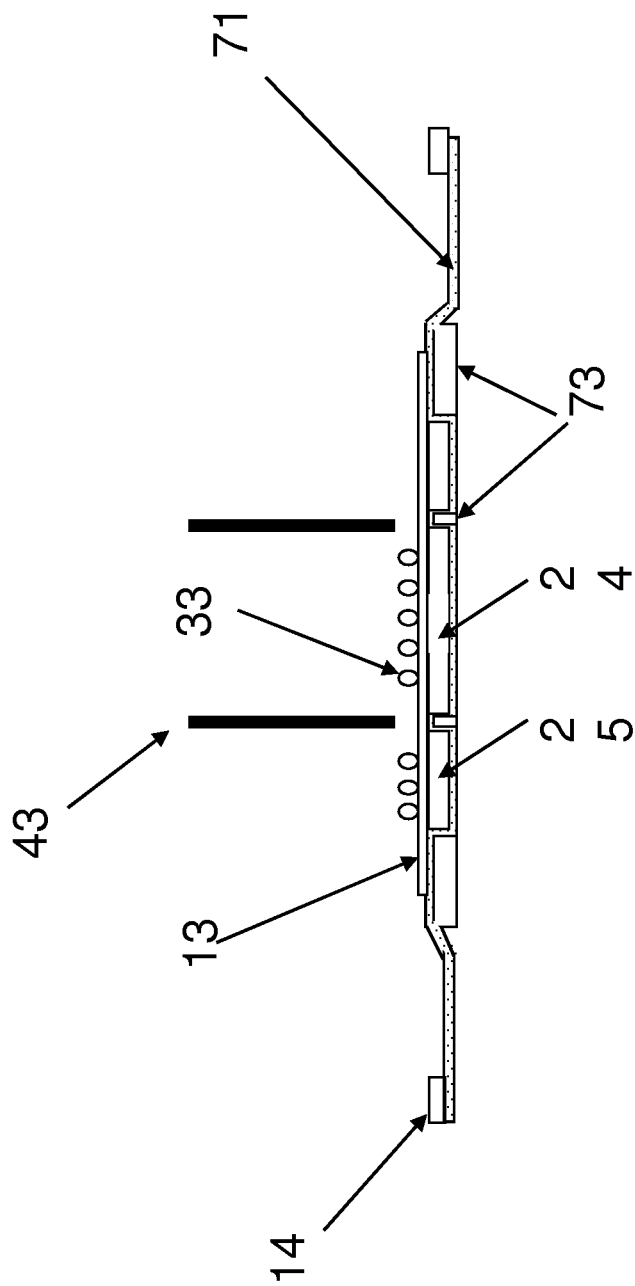
FIG. 11 depicts in a cross-section the alternative embodiment wafer carrier of FIG. 9 in use with an illustrative die on wafer assembly.

FIG. 11 depicts, in a cross-section, the wafer carrier 71 with substrate 13, integrated circuits dies 24 and 25, and solders balls 33 arranged in a die side down position and mounted on the wafer carrier 71. The wafer carrier 71 adheres to the exposed side of the integrated circuit dies 24 and 25, and in the gaps between the dies, or in the edge areas of the substrate 13 where there are no integrated circuit dies; the wafer carrier 71 is in contact with the substrate 13. The fixture 73 then has portions that fit in the gaps between the integrated circuit dies 24, 25, and also fill the space at the edges of the substrate 13 where no integrated circuit dies are mounted.

In FIG. 11, blades 43 which are saw blades are shown positioned on the solder ball side of the substrate 13. During the sawing operation, the blades which are rotating wet saw blades cut through the substrate 13 in scribe line areas, separating the interposer assembly into individual components as described above. The fixtures 73 support the interposer assembly during the dicing operation, preventing the problems associated with dicing using conventional approaches.

Figure 12:
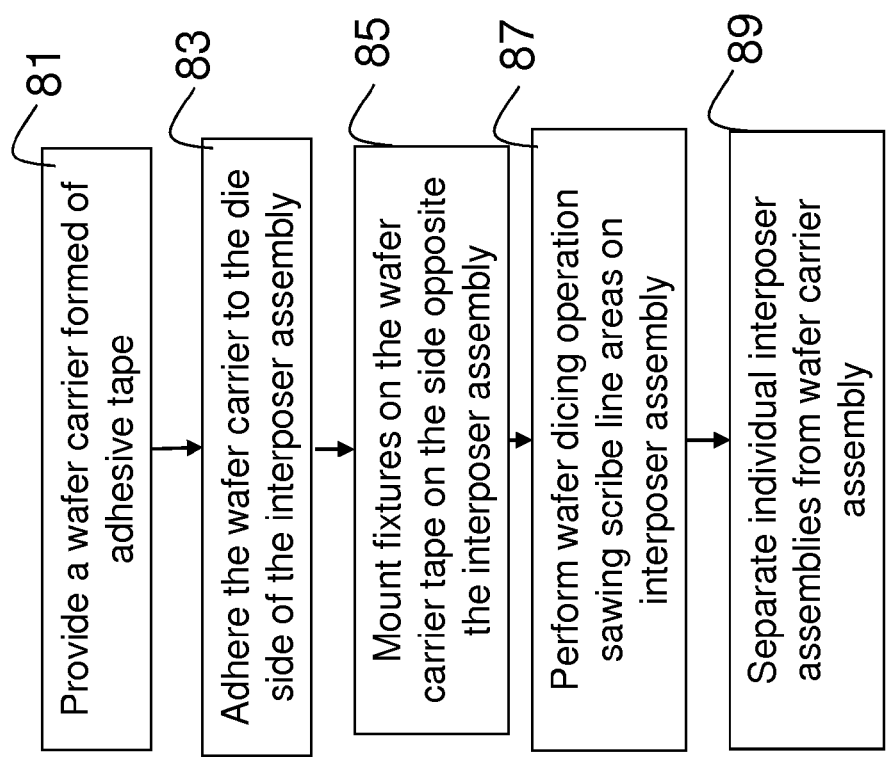
FIG. 12 depicts in a flow diagram an alternative embodiment method.

FIG. 12 depicts in a flow diagram a method embodiment using the carrier and fixture embodiments of FIGS. 9 and 10. In step 81, the wafer carrier is provided formed of a patterned adhesive tape, such as dicing tape or backgrinding tape. In step 83, the adhesive tape is adhered to the die side of the interposer assembly, the tape extending between the integrated circuit dies to the substrate, and covering the exposed sides of the integrated circuit dies. At step 85, fixture 73 is mounted on the opposite side of the adhesive tape between the integrated circuit dies, and filling the space at the edges of the substrate, to make a planar surface and support the thinned wafer substrate between the dies and at the edges. A dicing operation is performed at step 87 to cut through the substrate in the scribe line areas. In step 89, the individual assemblies are separated from the wafer carrier. If the tape used is UV erasable, a UV exposure may be done first to lessen the adhesive strength, and then, the sub-assemblies may be removed.

In an embodiment, a method includes receiving an interposer assembly including one or more integrated circuit dies mounted on a die side of an interposer substrate and having scribe areas defined in spaces between the integrated circuit dies; mounting the die side of the interposer assembly to a tape assembly, the tape assembly comprising an adhesive tape and spacers disposed between and filling gaps between the integrated circuit dies; and sawing the interposer assembly by cutting the scribe areas. In a further embodiment, the above method is performed wherein the interposer assembly comprises solder bump connections on an opposite side of the interposer assembly. In yet another embodiment, the above method is performed and further comprises following the sawing, exposing the tape assembly to a source of UV energy. In yet another embodiment, the method above is performed wherein the interposer substrate is a silicon wafer. In still another embodiment, in the above methods the interposer substrate comprises one or more through substrate vias (TSVs) extending through the interposer substrate. In a further embodiment, the interposer substrate is thinned to a thickness of less than 200 microns.

In yet another embodiment, the above methods are performed wherein mounting the die side of the interposer assembly to a tape assembly further comprises mounting spacers to an adhesive tape in a pattern corresponding to the gaps between the integrated circuit dies on the die side of the interposer substrate; and mounting the tape and the spacers on the die side of the interposer substrate, the spacers filling gaps between the integrated circuit dies.

In another embodiment, any of the above methods is performed wherein mounting the die side of the interposer assembly to a tape assembly further comprises mounting an adhesive tape over the die side of the interposer substrate, the adhesive tape extending into the gaps between the integrated circuit dies; and mounting preform spacers over the adhesive tape between the dies. In yet another embodiment, any of the above methods are performed and further include releasing the adhesive tape from the interposer assembly following the sawing step.

In still another alternative embodiment, a method comprises receiving an interposer assembly comprising a substrate, a plurality of through-substrate vias formed in the substrate, and a plurality of integrated circuit dies mounted on the substrate, wherein scribe areas are formed in spaces between the integrated circuit dies; mounting a tape assembly to the interposer assembly, the tape assembly comprising a tape layer and spacers disposed in the gaps between the integrated circuit dies; and sawing the interposer assembly through the scribe areas. In another embodiment, the above method is performed where the plurality of integrated circuit dies are grouped into a plurality of circuits each comprising at least two integrated circuit dies coupled to one another. In yet another embodiment, the above method is performed wherein the at least two integrated circuit dies have different thicknesses. In yet another embodiment, the above method is performed wherein the at least two integrated circuit dies have different functions. In still another embodiment the above methods are performed wherein the tape assembly has a size corresponding to the substrate of the interposer assembly. In yet another embodiment, any of the above methods are performed wherein at least one of the spacers has a thickness less than or equal to the greatest thickness of the integrated circuit dies. In a further embodiment, the above methods are performed wherein mounting the tape assembly to the interposer assembly comprises mounting the tape layer over the integrated circuit dies, the tape layer extending to the gaps between the integrated circuit dies; and mounting the spacers over the tape layer in the gaps between the integrated circuit dies.

In another embodiment, an apparatus comprises a plurality of integrated circuit dies mounted on a die side surface of an interposer, the integrated circuit dies having gaps between them; external connectors mounted on an opposite side of the interposer; and spacers disposed in the gaps between the integrated circuit dies on the die side of the interposer. In still another embodiment, the apparatus above further comprising a tape layer between the spacer and the interposer. In yet another embodiment, the apparatus above is provided, wherein the interposer is one selected from the group consisting of a silicon substrate and a glass substrate. In another embodiment, any apparatus above wherein the interposer comprises one or more through substrate vias extending through the interposer.

The scope of the present application is not intended to be limited to the particular illustrative embodiments of the structures, methods and steps described in the specification. As one of ordinary skill in the art will readily appreciate from the disclosure of the present invention, processes, or steps, presently existing or later to be developed, that perform substantially the same function or achieve substantially the same result as the corresponding embodiments described herein may be utilized according to the present invention. Accordingly, the appended claims are intended to include within their scope such processes or steps.

What is claimed is:

1. A method, comprising:
   receiving an interposer assembly including one or more integrated circuit dies mounted on a die side of an interposer substrate and having scribe areas defined in spaces between the integrated circuit dies;
   mounting the die side of the interposer assembly to a tape assembly, the tape assembly comprising an adhesive tape and spacers disposed between and filling gaps between the integrated circuit dies; and
   sawing the interposer assembly by cutting the scribe areas.

2. The method of claim 1, wherein the interposer assembly comprises solder bump connections on an opposite side of the interposer assembly.

3. The method of claim 1, further comprising:
   following the sawing, exposing the tape assembly to a source of UV energy.

4. The method of claim 1, wherein the interposer substrate is a silicon wafer.

5. The method of claim 1 wherein the interposer substrate comprises one or more through substrate vias (TSVs) extending through the interposer substrate.

6. The method of claim 1, wherein the interposer substrate is thinned to a thickness of less than 200 microns.

7. The method of claim 1, wherein mounting the die side of the interposer assembly to a tape assembly further comprises:

mounting spacers to an adhesive tape in a pattern corresponding to the gaps between the integrated circuit dies on the die side of the interposer substrate; and mounting the tape and the spacers on the die side of the interposer substrate, the spacers filling gaps between the integrated circuit dies.

8. The method of claim 1, wherein mounting the die side of the interposer assembly to a tape assembly further comprises:

mounting an adhesive tape over the die side of the interposer substrate, the adhesive tape extending into the gaps between the integrated circuit dies; and mounting preform spacers over the adhesive tape between the dies.

9. The method of claim 1, further comprising:

releasing the adhesive tape from the interposer assembly following the sawing step.

10. A method, comprising:

receiving an interposer assembly comprising a substrate, a plurality of through-substrate vias formed in the substrate, and a plurality of integrated circuit dies mounted on the substrate, wherein scribe areas are formed in spaces between the integrated circuit dies;

mounting a tape assembly to the interposer assembly, the tape assembly comprising a tape layer and spacers disposed between and filling gaps between the integrated circuit dies; and sawing the interposer assembly through the scribe areas.

11. The method of claim 10, where the plurality of integrated circuit dies are grouped into a plurality of circuits each comprising at least two integrated circuit dies coupled to one another.

12. The method of claim 11, wherein the at least two integrated circuit dies have different thicknesses.

13. The method of claim 11 wherein the at least two integrated circuit dies have different functions.

14. The method of claim 10, wherein the tape assembly has a size corresponding to the substrate of the interposer assembly.

15. The method of claim 14, wherein at least one of the spacers has a thickness less than or equal to the greatest thickness of the integrated circuit dies.

16. The method of claim 15, wherein mounting the tape assembly to the interposer assembly comprises:

mounting the tape layer over the integrated circuit dies, the tape layer extending to the gaps between the integrated circuit dies; and mounting the spacers over the tape layer in the gaps between the integrated circuit dies.

\* \* \* \* \*